United States Patent
Stache et al.

(10) Patent No.: US 8,120,146 B2
(45) Date of Patent: Feb. 21, 2012

(54) PROTECTED SEMICONDUCTOR DEVICE AND METHOD OF MANUFACTURING THEREOF

(75) Inventors: Joachim Stache, Uelzen (DE); Rainer Hoffmann, Hamburg (DE); Michael Burnus, Neu Wulmsdorf (DE)

(73) Assignee: NXP B.V., Eindhoven (NL)

( * ) Notice: Subject to any disclaimer, the term of this patent is extended or adjusted under 35 U.S.C. 154(b) by 694 days.

(21) Appl. No.: 12/161,786

(22) PCT Filed: Feb. 6, 2007

(86) PCT No.: PCT/IB2007/050393
§ 371 (c)(1),
(2), (4) Date: Jul. 22, 2008

(87) PCT Pub. No.: WO2007/091214
PCT Pub. Date: Aug. 16, 2007

(65) Prior Publication Data
US 2011/0062553 A1    Mar. 17, 2011

(30) Foreign Application Priority Data
Feb. 10, 2006   (EP) ..................................... 06101561

(51) Int. Cl.
*H01L 23/60* (2006.01)
(52) U.S. Cl. ................. 257/536; 257/238; 257/E21.002; 257/E23.002; 257/535; 257/532; 438/238; 438/396; 438/381
(58) Field of Classification Search .................. 257/536, 257/238, E21.002, E23.002, 535, 532; 438/238, 438/396, 381
See application file for complete search history.

(56) References Cited

U.S. PATENT DOCUMENTS

| 7,089,652 B2 * | 8/2006 | Akhtman et al. ............. 29/610.1 |
| 2003/0127706 A1 * | 7/2003 | Tanimura ....................... 257/536 |
| 2003/0228848 A1 * | 12/2003 | Escoffier et al. ................ 455/91 |
| 2007/0170546 A1 * | 7/2007 | Beach ............................ 257/532 |

FOREIGN PATENT DOCUMENTS

| KR | 20030001973 A | 1/2003 |
| WO | 2005024914 A | 3/2005 |

* cited by examiner

*Primary Examiner* — Marc Armand

(57) ABSTRACT

The semiconductor device (100) comprises at least one semiconductor element (20), a metallization structure comprising a first (31) and a second line (32) and extending thereon a resistor. An electrically insulating protection layer (36) is present on the resistor (35) and is defined in a pattern that is substantially identical to the resistor pattern and has a temperature stability up to a temperature that is at least equal to a deposition temperature of a passivation layer (37) to be deposited thereon so as to cover the metallization structure. Both the resistor (35) and the protection layer (36) are deposited conformally on the metallization structure and any underlying substrate.

11 Claims, 1 Drawing Sheet

PROTECTED SEMICONDUCTOR DEVICE AND METHOD OF MANUFACTURING THEREOF

FIELD OF THE INVENTION

The invention relates to a semiconductor device comprising a semiconductor substrate with at least one semiconductor element, and a thin-film resistor and a metallization structure comprising a first and a second line, between which lines and on which lines the resistor extends according to a desired resistor pattern, and a passivation layer covering the metallization structure and the resistor, while leaving bond pads in the metallization structure exposed.

The invention further relates to a method of manufacturing such a semiconductor device comprising the steps of:

defining at least one semiconductor element in the semiconductor substrate;

covering the substrate with an insulating layer;

providing a metallization structure on the insulating layer and extending in holes through the insulating layer to a contact the at least one semiconductor element, which structure comprises a first and second line that are mutually insulated, and at least one bond pad;

applying a thin-film resistor layer on the metallization structure and the substrate;

patterning the resistor layer with the help of a photoresist material according to a desired resistor pattern, such that the resistor forms a connection between the first and the second line of the metallization structure, and providing a passivation layer that leaves the at least one bond pad in the metallization structure exposed.

BACKGROUND OF THE INVENTION

Such a device and such a method are disclosed in the patent application WO-A 2005/024914. This application discloses the provision of a resistor partially on top of the metallization, such that the provision of etching holes can be dispensed with. By virtue thereof, the manufacturing method becomes more economical, and the obtained resistors exhibit a small spread, as there is no etching on the resistor layer. The resistor is made of a material containing, for example, titanium nitride, titanium tungsten or titanium tungsten nitride.

It is a disadvantage of the known device, that testing is possible only after completion of the manufacture. If the result is negative, then most probably not only the tested devices, but also those manufactured in a subsequent batch, will not fulfill the specifications set for the device, i.e. are outside a certain margin. Even though the known resistor has a small spread in comparison with a resistor with top contacts, there is nevertheless a substantial risk that the device is out of specifications. This is particularly the case for devices with a relatively low resistance, i.e. in which the resistor pattern has a relatively small area.

SUMMARY OF THE INVENTION

It is therefore an object of the invention to provide an improved method and an improved device of the kind mentioned in the opening paragraph, in which failures in production can be detected earlier.

The object relating to the device is achieved, in that the device comprises an electrically insulating protection layer is present between the resistor and the passivation layer, which protection layer has a uniform thickness and is defined in a pattern that is substantially identical to the resistor pattern and has a temperature stability up to a temperature that is at least equal to a deposition temperature of the passivation layer.

The object relating to the method is achieved in that an electrically insulating protection layer is applied on the thin-film resistor before patterning, which protection layer has a uniform thickness and a temperature stability up to a temperature that is at least equal to a deposition temperature of a passivation layer, and that the resistor layer and the protection layer are patterned in a single step subsequently.

Surprisingly, it was found that the resistance of the resistor turns out to be insensitive to any treatments carried out after the etching of the resistor layer, if a protection layer is present on top of the resistor. This means that the resistance does not change anymore after the patterning of the resistor. As a consequence, a test to check the resistance may be carried out in advance of the provision of the passivation layer. In order to achieve this effect, a protection layer is needed that has a uniform thickness and a sufficient temperature stability.

Suitable materials for the resistance layer include for instance titanium tungsten, titanium tungsten nitride, tantalum nitride, nickel chrome and silicon chrome. With these materials the full spectrum of resistor values from 20 $\Omega/\square$ to 1 $\Omega/\square$ can be implemented.

Suitable materials for the passivation layer include silicon nitride, silicon oxynitride, silicon oxide, polyimide and benzocyclobutene, but most suitably a silicon nitride, oxynitride or oxide is present that is deposited with plasma-enhanced chemical vapor deposition (PECVD). Such a technique allows the provision of a conformal layer, i.e. a layer that is deposited on a surface with topography in a uniform thickness.

Suitable materials for the protection layer are in particular inorganic materials, while organic materials such as polyimide, parylene, benzocyclobutene are not excluded. It is highly suitable that the material of the protection layer is structurally similar to both the resistor layer and the passivation layer. Similarity with the resistor layer is desired so as to enable etching with a single etchant in a single step, and such that the etching behavior of both layers is similar. Similarity with the passivation layer is desired so as to obtain a proper adhesion.

Most suitable materials for the protection layer are such as silicon nitride, silicon oxide and silicon oxynitride. These are more preferred above alternatives such as titanium oxide, in that these may be removed properly from surfaces that include an angle substantially unequal to zero degrees to the semiconductor substrate. Such surfaces are for instance side faces of the metal lines in the metallization structures. As the process is preferably not planarized with chemical-mechanical polishing or with planarization layers, the said angle is not known exactly and may vary over the semiconductor substrate. This would create even bigger problems with alternative materials.

A proper deposition method for the protection layer is chemical vapor deposition, and more preferred is PECVD. While the use of physical vapor deposition is possible, but expensive, the use of low pressure chemical vapor deposition is not allowed with an aluminum metallization; the temperature needed would damage the metallization structure. The use of spincoating or any other wet-chemical deposition technique is not suitable either, if there is a lack of planarity in the underlying structure.

Most suitably, the thickness of the protection layer is in the order of 20-200 nm. The upper limit is herein determined by the allowed spread in the resistance value. The lower limit is set by process conditions.

Most suitably, the resistor has a value of less than 100 $\Omega$. As the specifications have been defined in terms of a relative deviations, the allowable limits are arrived at earlier with small resistance values than with larger ones.

Preferably, the resistance value is defined in an isotropic dry etch process after the provision of the protection layer. This etching process leads to a highly reproducible shape of the resistance layer. It is an advantage of isotropic dry etching, in comparison to the more common anisotropic dry etching, that etching of non-planar structures is possible. The isotropic dry etching is furthermore preferred over isotropic wet etching, as the latter provides less reproducible results. Contaminations of the bath of the etching solution lead to unacceptable deviations of the resistance value. Already the mere etching of a resistor layer provides such contamination for the etching of a resistor layer in a subsequent batch.

In a preferred embodiment, the resistor is part of a filter. A suitable filter is for instance a band pass filter or pass band filter, such as a low-pass filter. The design of filters is in principle well-known, and different filter types may be used, such as RC and RCL filters. A suitable topology is for instance that of a π-filter or a modified T-filter, in which the capacitor is connected between a signal line and ground. A reversely connected diode may be used as an alternative, since the capacitance of the diode is often sufficient to obtain the required capacitance. Such capacitances may be in the order of 70-80 pF, but also in the order of 10-20 pF.

The semiconductor element is suitably a protection element against electrostatic discharge (ESD). In this case, the semiconductor element is coupled between a signal line having an input and an output, and ground. The resistor is part of the signal line.

More particularly and preferably, the protection element of the present invention provides protection against high discharge pulses, while ESD-protection circuits implemented in an integrated circuit that is protected by the device, will absorb the discharge pulses of lower voltages. An integrated circuit conventionally has a discharge protection of 2 kV according the Human Body Model (Method MIL883E-3015.7) of contact, and the protection element in the device preferably at least 8 kV of contact (according IEC61000-4-2, Level 4).

Advantageously, the substrate comprises an electrically conductive substrate region, a first region of a first conductivity type, a second region of a second conductivity type adjoining a surface of the substrate and having an interface with the first region defining a junction, and wherein the substrate further comprises a third electrically conductive region extending within the first region from the junction to the substrate region.

In this embodiment, the protection elements are diodes that are coupled to an electrically conducting buried region in the substrate. Diodes have a good performance as protection elements. Particularly preferred are Zener diodes. The electrically conducting buried region is excellent for the object of ESD, due to the fact that it can lead the current away easily, in the event of a charge arriving at the ESD diodes. The current is then led to ground through the solder balls. An advantage of this buried region is that it constitutes a ground plane at a short distance from the first surface, and hence provides interconnects in the metallization structure with a transmission line character.

Most suitably, the insulating layer on top of the semiconductor substrate is formed in a low temperature process. It is for instance an oxide or a nitride that is deposited in a chemical vapor deposition process, or an oxide layer that is formed by wet-chemical oxidation of the substrate. However, it is not a thermal oxide, such as conventionally applied on semiconductor substrates, as the application of a thermal oxide after definition of the substrate regions would lead to diffusion of charge carriers through the substrate.

The invention does not only relate to the method of manufacturing a semiconductor device and the semiconductor device thus made. It further relates to an intermediate product comprising a semiconductor substrate and a plurality of semiconductor devices. Such an intermediate product is conventionally referred to as a 'wafer'.

According to the invention, it comprises a resistor and a protection layer in substantially the same pattern as the resistor, which resistor extends between and on top of a first and a second metallization line that are otherwise electrically insulated from each other. The intermediate product is suitable for deposition of a passivation layer, which however has not yet been deposited.

According to a further aspect of the invention, at least some of the devices of this intermediate product are tested prior to the deposition of the passivation layer.

The testing of this intermediate product is enabled by the insight that the resistance value does not change anymore during deposition of the passivation layer and/or any further packaging processes.

Testing, and evidently process control, is of the utmost importance, particularly when the number of devices per wafer is huge. This is for instance the case when the devices of the invention are so-called semi-discrete products or integrated discretes product. Such devices usually comprise less than ten semiconductor elements and a comparable or even smaller number of resistors. Conventionally, in the field of discrete devices, individual devices are tested and therewith sorted so as to distinguish different quality classes. The devices of different classes are sold for different purposes. However, due to the incorporation of resistors into the semi-discrete product, such definition of different classes is not possible anymore; the resistance value and the design of integrated device effectively define the purpose of the device. As a consequence, the requirements to process control are much stricter. Due to testing at the stage of the intermediate products, deviations of the required process can be detected earlier. Testing may be carried out on the devices themselves, on test structures available on the intermediate product and/or with the help of additional test wafers specifically designed to test the quality of a certain step, such as a deposition step or a patterning step.

BRIEF DESCRIPTION OF THE DRAWING

These and other aspects of the invention will be further elucidated with reference to the Figures, in which.

DETAILED DESCRIPTION OF EMBODIMENT

Figure 1:
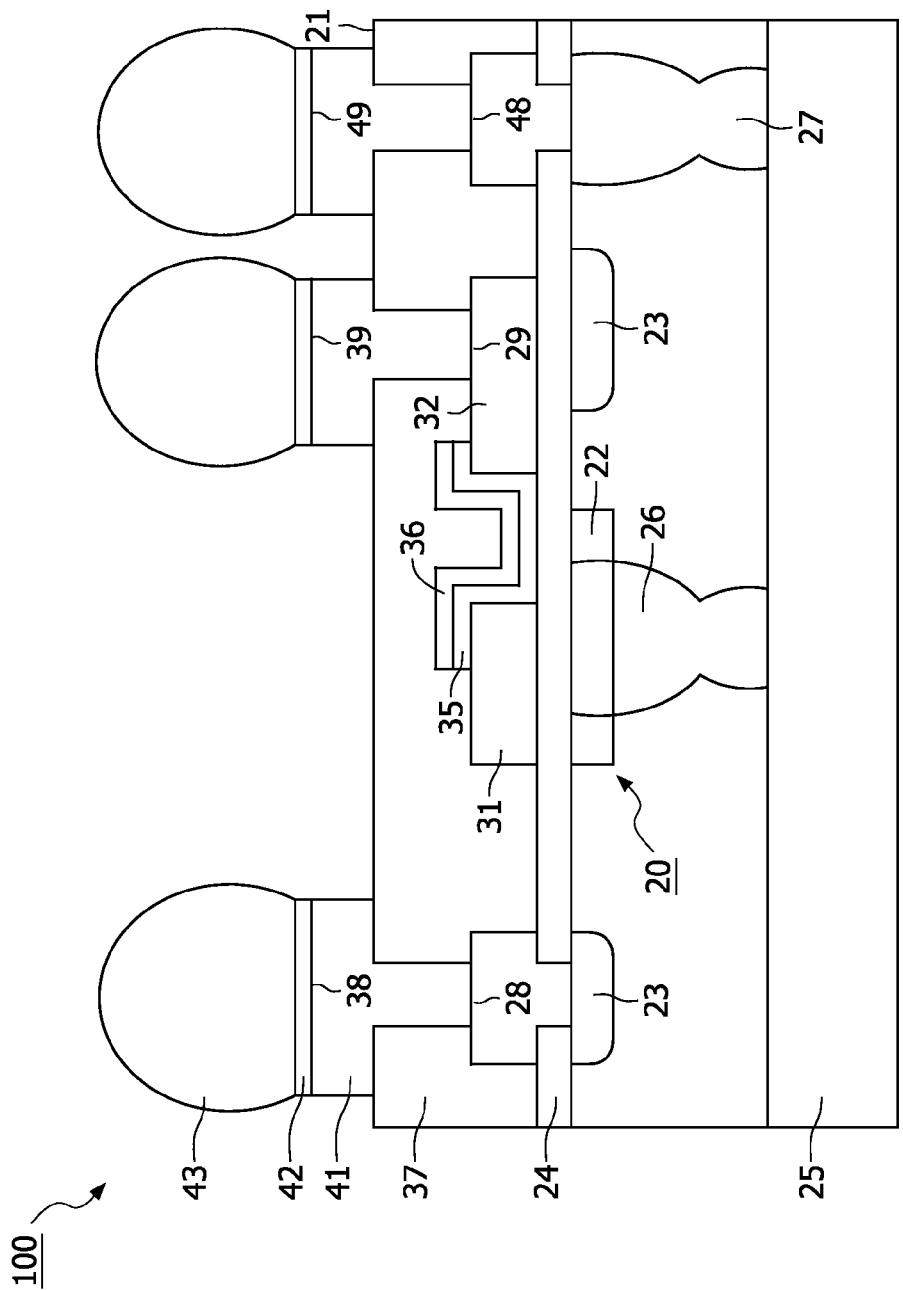
FIG. 1 shows a diagrammatical cross-sectional section of a device of the invention.

The FIGURE is not drawn to scale and equal reference numerals in different Figures refer to equal parts of the device. It is purely diagrammatical and not drawn to scale and not meant to be limiting for the scope of the invention.

FIG. 1 shows diagrammatically a cross-sectional view of the semiconductor device 100, in which the semiconductor elements are diodes and used as protection elements against ESD discharge. The device 100 comprises a first side 21, with a metallization structure. The metallization structure comprises internal bond pads 27, 28, 29, as well as a first line 31 and a second line 32. The bond pads 27-29 are connected to contact pads 38, 39, 49, to which solder balls 43 are applied.

In this example, contact pad 38 functions as input for the device 100 and contact pad 39 functions as output for the device 100. Contact pad 49 allows an additional connection to ground. A resistor 35 is coupled between the first and the second line 31,32 of the metallization structure 30. The resistor is present on top of an insulating layer 24, which also acts as a substrate for the metallization structure. A protection layer 36 is provided on top of the resistor layer 35 and has substantially the same pattern as the resistor 35. The resistor 35 has in this case a value of 100 Ω and is constituted by a layer of TiWN in this example. Its thickness is in the order of 10-150 nm. The protection layer 36 comprises in this example silicon nitride and has been deposited by phase enhanced chemical vapor deposition. Its thickness is in the order of 50-200 nm.

The protection element 20 in the device of the invention is a Zener diode in backward direction. The Zener diode 20 comprises a first region 22 and a second region 23 that are doped with dopants of the opposite type, e.g. n-type and p-type. The second region 23 is a ring-shaped and located at a distance from the first region. The first region 22 is n-type doped and preferably has a high electrical conductivity of less than 10 Ω/☐. A buried region 26, herein p-type doped, is connected to a well-conducting and highly p-type doped region 25 in the substrate. This region 25 acts as internal ground. It is connected to the ground pad 48 with buried region 27. The size and choice of this diode 20 as protection element in combination with the buried region 26 allows its use as protection element for very high ESD pulses, e.g. of 8 kV or more. In addition to this diode 20 with a buried region 26, other diodes may be defined in the same process without such buried region 26. Alternatively, bipolar transistors are used as protection elements.

A passivation layer 37 is defined on top of the metallization structure and the protection layer 36. The passivation layer 37 has a thickness in the order of 0.5-2.0 μm. It includes apertures that expose the underlying bond pads 48, 28,29 at least partially. The device 100 is on its contact pads 48,28,29 provided with an underbump metallization 41, which is for the first and the second contact pads 28,29 and ground pad 48 provided in a single process step. The underbump metallization 41 comprises for instance an aluminum layer with a nickel-gold top layer 42. Solder balls, for instance of Sn—Ag—Cu in known composition may be applied. Suitable diameters are for instance in the range of 200-500 micrometers. This provides a chip-scale package wherein the device 100 may be assembled to a printed circuit board directly, without any further carrier. However, any other packaging, such as a leadframe package, is not excluded. In that case, wirebonds are applied on the underbump metallization 41 instead of solder balls 43.

In a further embodiment, the underbump metallization 41 comprises Ni and the top layer 42 is a Ni-protection layer, such as a Ti layer. The underbump metallization 41 is for instance about 1 microns thick, while the top layer 42 has a thickness of about 0.1 microns. This top layer 42 ensures that the Ni-layer does not oxidize during any photolithographic patterning steps that are carried out with the help of a photoresist. In such steps, the underbump metallization 41 may be patterned so as to include any wiring on top of the passivation layer 37. After finalization of the manufacture, the nickel protection layer 42 will then be removed at least partially to expose the nickel of the underbump metallization 41. The nickel forms a proper adhesion material for the solder.

According to the invention, the resistor layer is structured into a resistor according to a desired pattern photolithographically, e.g. with the use of an etch mask, and only after deposition of an electrically insulating protection layer. The etch mask turns out problematic for the stability of the resistor; particularly its removal is problematic. It has turned out that both the dry etch and the wet etch treatment that are needed for the removal of photoresist material used for the provision of the etching pattern influence the resistance value without any protection.

Due to the structure of the invention, wherein the resistor is connected to the metallization lines on its bottom side, there is no need for removal or patterning of the electrically insulating protection layer.

Due to the small thickness in which the protection layer is deposited, it allows the simultaneous etching of the protection layer and the resistor layer with an isotropic method, particularly an isotropic dry etch. Such isotropic dry etch is needed in view of the lack of planarity of the structure.

It is not excluded that an integrated circuit is assembled to the first side 21 of the device 100 of the invention, so as to form a functional entity. These will be coupled to the device 100 with solder balls of smaller size then the solder balls 43 that are indicated in the FIGURE.

The invention claimed is:

1. A semiconductor device comprising a semiconductor substrate with at least one semiconductor element, and a thin-film resistor and a metallization structure comprising a first and a second line, between which lines and on which lines the resistor extends according to a desired resistor pattern, and a passivation layer covering the metallization structure and the resistor, while leaving bond pads in the metallization structure exposed,
   wherein an electrically insulating protection layer is present between the resistor and the passivation layer, which protection layer has a uniform thickness and is defined in a pattern that is substantially identical to the resistor pattern and has a temperature stability up to a temperature that is at least equal to a deposition temperature of the passivation layer.

2. A semiconductor device as claimed in claim 1, wherein the resistor is part of a filter.

3. A semiconductor device as claimed in claim 1, wherein the resistor has a resistive value of less than 100 Ω/☐.

4. A semiconductor device as claimed in claim 1, wherein the protection layer comprises an inorganic material and is deposited conformally.

5. A semiconductor device as claimed in claim 1, wherein the semiconductor element is a protection element against electrostatic discharge and is coupled between a signal line between an input and an output and ground, while the resistor is defined in the signal line.

6. A semiconductor device as claimed in claim 5, wherein the substrate comprises an electrically conductive substrate region, a first region of a first conductivity type, a second region of a second conductivity type adjoining a surface of the substrate and having an interface with the first region defining a junction, and wherein the substrate further comprises a third electrically conductive region extending within the first region from the junction to the substrate region.

7. A method of manufacturing a semiconductor device provided with a semiconductor substrate, comprising the steps of:
   defining at least one semiconductor element in the semiconductor substrate;
   covering the substrate with an insulating layer;
   providing a metallization structure on the insulating layer and extending in holes through the insulating layer to a contact the at least one semiconductor element, which structure comprises a first and second line that are mutually insulated, and at least one bond pad;

applying a thin-film resistor layer on the metallization structure and the substrate;

applying an electrically insulating protection layer on the thin-film resistor, which protection layer has a temperature stability up to a temperature that is at least equal to a deposition temperature of a passivation layer;

patterning the resistor layer and the protection layer with the help of a photoresist material according to a desired resistor pattern, such that the resistor forms a connection between the first and the second line of the metallization structure, and providing a passivation layer that leaves the at least one bond pad in the metallization structure exposed.

8. A method as claimed in claim 7, wherein the patterning of the resistor layer and the protection layer is carried out with an isotropic dry etch.

9. A method as claimed in claim 7, wherein the insulating layer is applied with a deposition technique at a temperature sufficiently low to prevent diffusion of charge carriers defined in regions in the substrate.

10. A method as claimed in claim 7 and a semiconductor device comprising a semiconductor substrate with at least one semiconductor element, and a thin-film resistor and a metallization structure court a first and a second line, between which lines and on which lines the resistor extends according to a desired resistor pattern, and a passivation layer covering the metallization structure and the resistor, while leaving bond pads in the metallization structure exposed, wherein an electrically insulating protection layer is present between the resistor and the passivation layer, which protection layer has a uniform thickness and is defined in a pattern that is substantially identical to the resistor pattern and has a temperature stability up to a temperature that is at least equal to a deposition temperature of the passivation layer; and wherein the protection layer has an interface with the passivation layer.

11. An intermediate product comprising a semiconductor substrate and a plurality of device structures, each of which structures comprises at least one semiconductor element, a thin-film resistor and a metallization structure comprising a first and a second line, between which lines and on which lines the resistor extends according to a desired resistor pattern, wherein an electrically insulating protection layer is present on top of the resistor, which protection layer is defined in a pattern that is substantially identical to the resistor pattern and has a temperature stability up to a temperature that is at least equal to a deposition temperature of a passivation layer deposited or to be deposited on top of the device structures.

* * * * *